United States Patent
Schultz et al.

(10) Patent No.: US 6,980,439 B2
(45) Date of Patent: Dec. 27, 2005

(54) EMI SHIELD FOR TRANSCEIVER

(75) Inventors: Craig L. Schultz, Fremont, CA (US); Todd Micheal Petit, Santa Clara, CA (US); Joshua T. Oen, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 10/033,688

(22) Filed: Dec. 27, 2001

(65) Prior Publication Data

US 2003/0123230 A1 Jul. 3, 2003

(51) Int. Cl.[7] .............................. H05K 5/00; H05K 5/04; H05K 5/06; H05K 9/00; H05K 7/12
(52) U.S. Cl. .................. 361/753; 361/799; 361/816; 361/818; 361/748; 361/760; 361/767; 361/803; 174/52.2
(58) Field of Search ........................... 361/753, 799, 361/800, 816, 818, 312, 320, 748, 719, 720, 723, 724, 760–764, 767–771, 803; 174/35 R, 35 GC, 52.2, 52.3, 52.4; 439/607; 257/700, 704, 723, 724, 697, 706, 707, 713, 718, 719, 728, 691

(56) References Cited

U.S. PATENT DOCUMENTS

| 5,550,713 | A | * | 8/1996 | Pressler et al. ............. 361/818 |
| 5,557,142 | A | | 9/1996 | Gilmore et al. |
| 6,043,983 | A | * | 3/2000 | Taylor et al. ............... 361/704 |
| 6,206,728 | B1 | * | 3/2001 | Krehbiel et al. ............ 439/607 |
| 6,271,465 | B1 | | 8/2001 | Lacey |

* cited by examiner

Primary Examiner—Phuong T. Vu
(74) Attorney, Agent, or Firm—Kenneth J. Cool (57) ABSTRACT

An integrated circuit packages comprises a printed circuit board, a non-metal connector, and a metal casing. The printed circuit board includes a ground ring around the non-metal connector. The metal casing substantially encloses the printed circuit board, and has an opening that allows access to the non-metal connector. The metal casing has a metal lip that makes physical and electrical contact with the ground ring of the printed circuit board. The metal casing may be used to help reduce EMI from a transmitter.

15 Claims, 6 Drawing Sheets

EMI SHIELD FOR TRANSCEIVER

BACKGROUND OF THE INVENTION

1. Field of the Invention

The described invention relates to the field of integrated circuits. In particular, the invention relates to reducing electromagnetic interference (EMI) from a transmitter.

2. Description of Related Art

A transmitter operating at high frequencies, such as 10 Ghz, emits electromagnetic (EM) radiation from its integrated circuit package. The EM radiation may interfere with other electronic equipment. Thus, reducing EMI from a high-frequency transmitter is important.

DETAILED DESCRIPTION

A metal shield is used for reducing EMI from a transmitter or transceiver. The integrated circuit package for the transmitter/transceiver comprises a printed circuit board, a non-metal connector, and a metal casing. The printed circuit board includes a ground ring around the non-metal connector. The metal casing substantially encloses the printed circuit board and has an opening that allows access to the non-metal connector. The metal casing has a metal lip that makes physical and electrical contact with the ground ring of the printed circuit board. In one embodiment, a second metal shield may be employed to reduce clock jitter.

Figure 1:
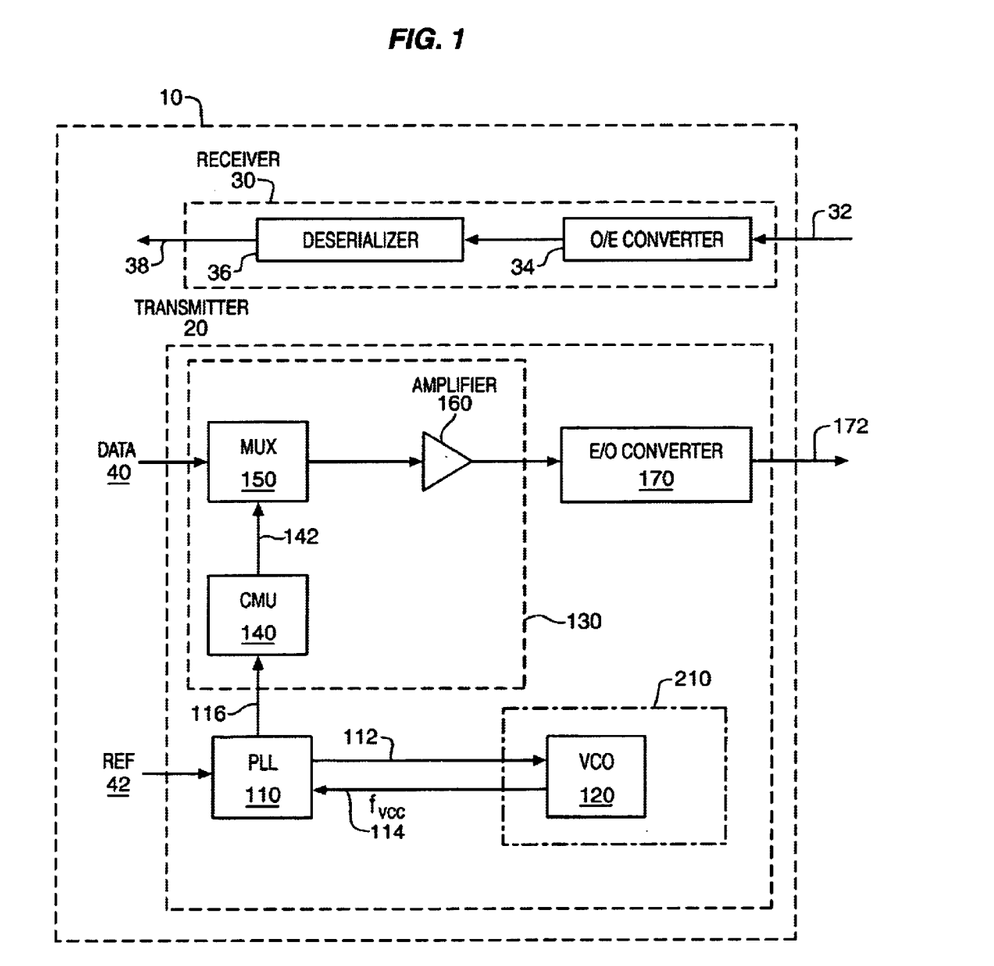
FIG. 1 is a schematic diagram showing one embodiment of a transceiver.

FIG. 1 is a schematic diagram showing one embodiment of a transceiver 10. The transceiver 10 comprises a transmitter 20 and a receiver 30. The receiver 30 receives optical data 32, converts it to electrical data via an optical-to-electrical converter 34, and deserializes the electrical data with a deserializer 36 to provide an electrical signal 38. The transmitter 20 receives electrical data 40, converts it to optical signals and sends the optical data 172 out via an optical interconnect, such as an optical fiber.

The transmitter 20 comprises a phase lock loop (PLL) 110, an oscillator 120, a serializer 130, and an electrical-to-optical converter 170. In one embodiment, the oscillator 120 is a voltage-controlled oscillator (VCO). The PLL 110 receives a reference input 42 and provides a voltage 112 to the VCO 120. The VCO 120 provides a frequency signal $f_{VCO}$ 114 to the PLL 110, and the PLL 110 provides a clock signal 116 to the serializer 130.

In one embodiment, the serializer 130 comprises a clock multiplier unit (CMU) 140, a multiplexer 150 and an amplifier 160. The CMU 140 multiplies the clock signal provided to it by the PLL 110, and provides the multiplied clock signal to the multiplexer (MUX) 150 which serializes input data 40. In one embodiment, the MUX 150 is a 16:1 multiplexer, and the CMU 140 multiplies the clock signal 116 by 16 to yield a 10 GHz clock signal 142. The output of the MUX 150 is amplified by amplifier 160 and provided to the electrical-to-optical converter 170, which then sends out the optical data 172.

Clock jitter generated in the transceiver 10 is a composite of inherent clock jitter based on the quality of the reference signal and the oscillator 120 and PLL 110, as well as noise such as pattern-dependent noise from, e.g., the switching of the MUX 150. Clock jitter may cause data reliability problems if the jitter is too high. In one embodiment, a metal shield 210 is placed around the oscillator 120 to reduce the clock jitter. The metal shield combined with a ground plane, as will be described with respect to FIGS. 2 and 3, form a Faraday cage around the oscillator 120. This reduces the electromagnetic interference (EMI) of other components from interfering with the oscillator 120, which results in reduced clock jitter for the transmitter.

Figure 2:
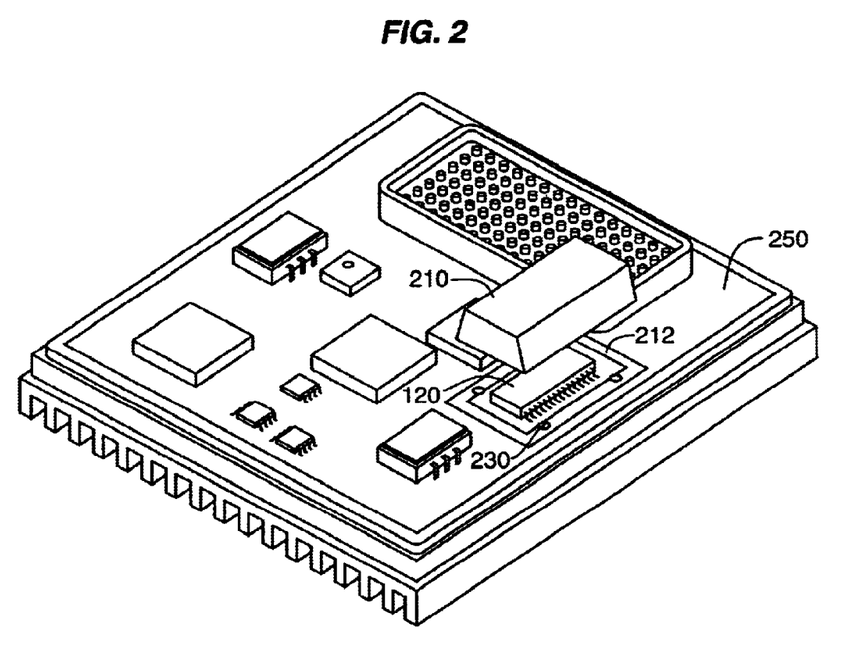
FIG. 2 is a 3-D diagram of a transceiver showing a metal shield 210 positioned to cover the oscillator 120.

FIG. 2 is a 3-D diagram of a transceiver showing a metal shield 210 positioned to cover the oscillator 120. A ground ring 212 on the printed circuit board (PCB) 250 surrounds the oscillator and is coupled to one or more ground planes of the PCB 250. In one embodiment, the ground ring 212 is coupled to the ground planes through vias in the PCB 250. In one embodiment, two or more holes 230 are used to help align the metal shield 210 as will be discussed below.

Figure 3:
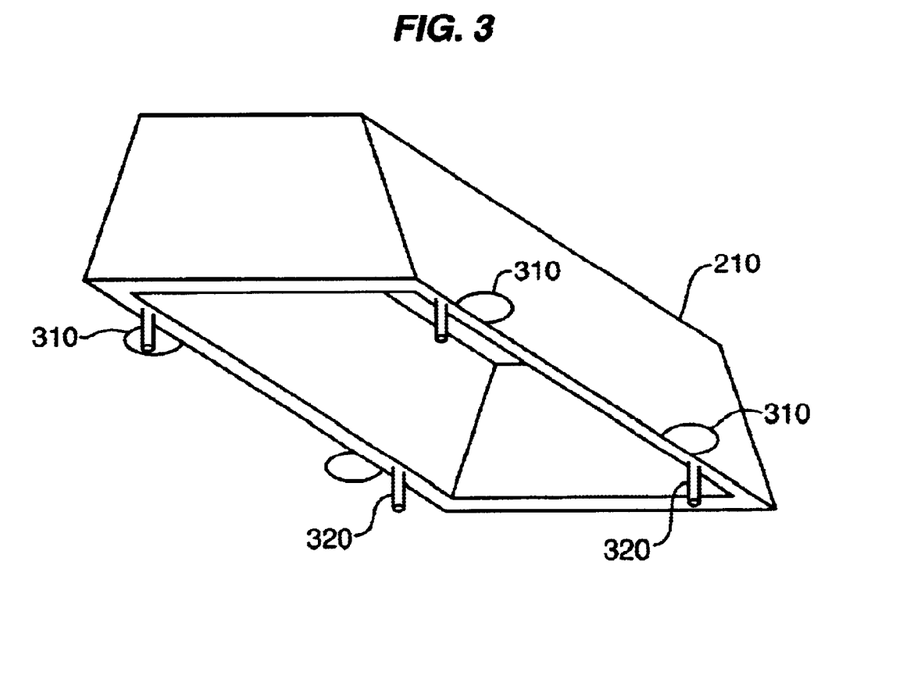
FIG. 3 is a 3-D diagram that shows one example of a metal shield.

FIG. 3 is a 3-D diagram that shows one example of a metal shield 210. In one embodiment, the metal shield 210 has a plurality of protrusions. Attachment protrusions 310 allow the metal shield to be coupled to the ground ring and the printed circuit board. In one embodiment, the metal shield is soldered to the ground ring via the attachment protrusions 310. In another embodiment, the attachment protrusions 310 may feature a hole that allows a screw to hold the metal shield 210 to the printed circuit board 250.

Positioning protrusions 320 allow the metal shield to be aligned properly on the printed circuit board. In one embodiment, the positioning protrusions 320 are inserted into holes 230 (FIG. 2) in the printed circuit board.

Figure 4:
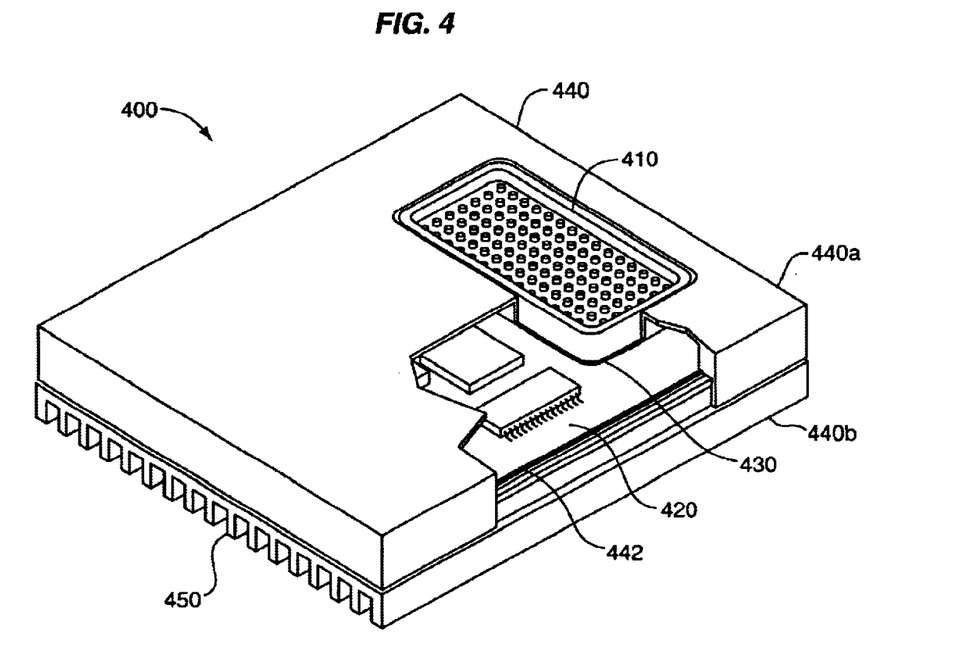
FIG. 4 is a 3-dimensional diagram showing a cutaway view of a transceiver.

FIG. 4 is a 3-dimensional diagram showing a cutaway view of a transceiver 400. A non-metal connector 410 is attached to a printed circuit board (PCB) 420. A ground ring 430 surrounds the non-metal connector 410. In one embodiment, the "non-metal connector" comprises a plastic or ceramic, but also comprises metal interconnects for providing data, control, and status I/O to and from the transceiver.

A metal casing 440 substantially encloses the PCB 420. In one embodiment, the metal casing 440 comprises a top portion 440a that substantially covers a top portion of the PCB 420, and a bottom portion 440b that substantially covers a bottom portion of the PCB 420. The metal casing 440 makes physical and electrical contact with the ground ring 430. The top portion 440a and/or bottom portion 440b may comprise a heat sink 450 having multiple fins.

In one embodiment, a top perimeter ground ring 442 surrounds a perimeter of the top surface of the PCB 420, and the top portion of the metal casing 440a makes electrical contact with the perimeter ground ring 442.

Figure 5:
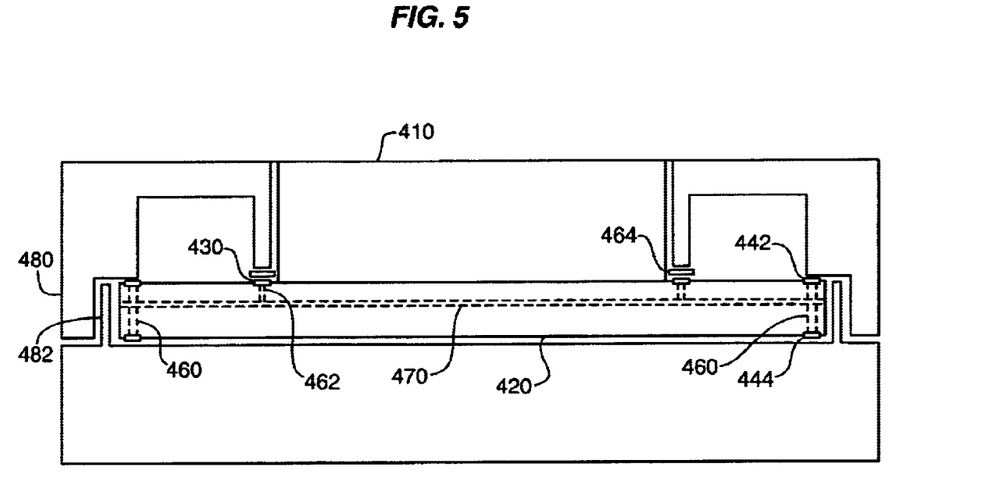
FIG. 5 is a cross-sectional side-view of the transceiver of FIG. 4.

FIG. 5 is a cross-sectional side-view of the transceiver of FIG. 4. A bottom perimeter ground ring 444 may surround a bottom perimeter of the PCB 420. Vias 460 couple the top perimeter ground ring 442 with the bottom perimeter ground ring 444. In one embodiment, the vias 460 are spaced intermittently around the top and bottom perimeter ground rings 442, 444.

The ground ring 430 surrounds the non-metal connector 410. In one embodiment, the ground ring 430, top perimeter ground ring 442, and bottom perimeter ground ring 444 are all electrically coupled together by vias 460, 462 and an internal ground plane 470. A conductive gasket 464 may be inserted between the top conductive portion of the metal casing 440a and the ground ring 430 to provide a good electrical coupling.

In one embodiment, the top portion of the metal casing 440a at least partially overlaps a perimeter of the bottom portion of the metal casing 440b through their respective edges 480 and 482. Alternatively, the bottom portion 440b could be manufactured to overlap a perimeter of the top portion 440a.

Figure 6:
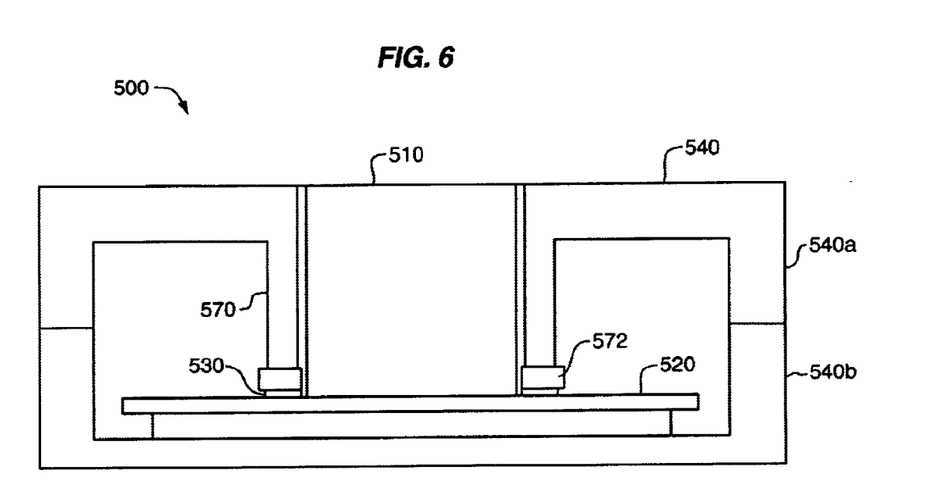
FIG. 6 is a cross-section side-view that shows an alternate embodiment of a transceiver.

FIG. 6 is a cross-section side-view that shows an alternate embodiment of a transceiver 500. The transceiver circuitry resides on a PCB that is enclosed by a metal casing 540. In one embodiment the metal casing comprising a top half 540a and a bottom half 540b that make physical and electrical contact with one another. In one embodiment, a conductive gasket (not shown) may be inserted between the two metal casings 540a, 540b to provide a better contact.

A non-metal connector 510 is coupled to the PCB 520 and extends up through an opening in the metal casing 540 so as to be accessible from outside of the integrated circuit package. A ground ring 530 on the PCB 520 surrounds the non-metal connector 510.

In one embodiment, the metal casing 540 includes a metal lip 570 that makes physical and electrical contact with the ground ring 530 of the PCB 520. A conductive gasket 572 may be inserted between the metal lip 570 and the ground ring 530 to provide good electrical coupling.

Thus, a metal shield for reducing EMI from a transceiver is disclosed. However, the specific embodiments and methods described herein are merely illustrative. For example, a conductive gasket may serve at an interface along with any of the described ground rings. Numerous modifications in form and detail may be made without departing from the scope of the invention as claimed below. The invention is limited only by the scope of the appended claims.

What is claimed is:

1. An integrated circuit package comprising:
   a printed circuit board having a ground ring connected to a ground plane of the printed circuit board;
   a non-metal connector attached to the printed circuit board within the ground ring;
   a metal casing substantially enclosing the printed circuit board but not enclosing the non-metal connector, the metal casing having a metal lip that makes physical and electrical contact with the ground ring of the printed circuit board, the metal casing comprising a first metal portion that substantially covers a top surface of the printed circuit board, and a second metal portion that substantially covers a bottom surface of the printed circuit board, wherein a perimeter edge of the first metal portion at least partially overlaps a perimeter edge of the second metal portion; and
   a first perimeter ground ring disposed on the printed circuit board that at least partially and concentrically encloses the ground ring, the first perimeter ground ring making electrical contact with at least one of the first metal portion or the second metal portion.

2. The integrated circuit package of claim 1, wherein the second metal portion comprises a heat sink having a plurality of fins.

3. The integrated circuit package of claim 2, wherein the second metal portion, makes electrical contact with a second perimeter ground ring on the bottom surface of the printed circuit board, the second perimeter ground ring substantially circling the bottom surface of the printed circuit board, the second perimeter ground ring being electrically coupled to the ground plane.

4. The integrated circuit package of claim 3, wherein the first perimeter ground ring is coupled to the second perimeter ground ring by a plurality of vias spaced intermittently around the first and second perimeter ground rings.

5. A transmitter comprising:
   a printed circuit board having a top surface and a bottom surface, the top surface having a first perimeter ground ring, and the bottom surface having a second perimeter ground ring, the first perimeter ground ring substantially circling the top surface of the printed circuit board, the second perimeter ground ring substantially circling the bottom surface of the printed circuit board;
   a first metal casing substantially covering the top surface of the printed circuit board, the first metal casing being in electrical contact with the first perimeter ground ring;
   a second metal casing substantially covering the bottom surface of the printed circuit board, the second metal casing being in electrical contact with the second perimeter ground ring, wherein a perimeter edge of a first metal portion at least partially overlaps a perimeter edge of a second metal portion; and
   an internal around ring concentrically disposed within at least one of the first perimeter ground ring or the second perimeter ground ring and electrically coupled to at least one of the first metal casing or the second metal casing to allow a connector to connect to the printed circuit board through the internal ground ring.

6. The transmitter of claim 5 comprising: p1 a plurality of vias electrically coupling the first perimeter ground ring with the second perimeter ground ring.

7. The transmitter of claim 5 comprising:
   a ground ring on the top surface of the printed circuit board;
   a non-metal connector coupled to the top surface of the printed circuit board, within the ground ring, wherein the first metal casing surrounds a perimeter of the non-metal connector and makes electrical contact with the ground ring.

8. The transmitter of claim 5, wherein the second metal casing has fins and serves as a beat sink.

9. A method of reducing EMI from a transceiver, the method comprising:
   attaching a non-metal connector to a printed circuit board having a ground ring;
   surrounding the printed circuit board with a metal shield except for the non-metal connector, to metal shield making physical and electrical contact with the ground ring;
   at least partially overlapping a perimeter edge of a first portion of the metal shield with a perimeter edge of a second portion of the metal shield; and
   making electrical contact between a first metal casing and a first perimeter ground ring circling a top surface of the printed circuit board and at least partially disposing the ground ring concentrically within the first perimeter ground ring.

10. The method of claim 9 further comprising:
    inserting an electrically conductive gasket between the metal shield and the ground ring.

11. The method of claim 9, wherein surrounding the printed circuit board with a metal shield further comprises:

covering a top surface of the printed circuit board with the first metal casing having an opening for the non-metal connector, and covering a bottom surface of the printed circuit board with a second metal casing.

12. The method of claim 11, wherein covering the top surface of the printed circuit board further comprises:

making electrical contact between the first metal casing and the first perimeter ground ring circling the top surface of the printed circuit board.

13. The method of claim 12 further comprising:

inserting an electrically conductive gasket between the first metal casing and the first perimeter ground ring.

14. The method of claim 11, wherein covering the bottom surface of the printed circuit board further comprises:

making electrical contact between the second metal casing and a second perimeter ground ring circling the bottom surface of the printed circuit board.

15. The method of claim 14 further comprising: inserting an electrically conductive gasket between the second metal casing and the second perimeter ground ring.

* * * * *

UNITED STATES PATENT AND TRADEMARK OFFICE
CERTIFICATE OF CORRECTION

PATENT NO. : 6,980,439 B2
APPLICATION NO. : 10/033688
DATED : December 27, 2005
INVENTOR(S) : Schultz et al.

It is certified that error appears in the above-identified patent and that said Letters Patent is hereby corrected as shown below:

In column 3, at line 67, delete "2," and insert --1,--.
In column 4, at line 29, delete "around" and insert --ground--.
In column 4, at line 35, delete "p1".
In column 4, at line 47, delete "beat" and insert --heat--.
In column 4, at line 53, delete "to" and insert --the--.

Signed and Sealed this

Thirteenth Day of November, 2007

JON W. DUDAS
*Director of the United States Patent and Trademark Office*